US010388704B2

(12) United States Patent
Guo

(10) Patent No.: US 10,388,704 B2
(45) Date of Patent: Aug. 20, 2019

(54) ORGANIC ELECTROLUMINESCENCE DEVICE AND METHOD FOR PRODUCING THE SAME

(71) Applicants: BOE Technology Group Co., Ltd., Beijing (CN); Hefei BOE Optoelectronics Technology Co., Ltd., Anhui (CN)

(72) Inventor: Yuanhui Guo, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/127,026

(22) PCT Filed: Sep. 10, 2015

(86) PCT No.: PCT/CN2015/089345
§ 371 (c)(1),
(2) Date: Sep. 18, 2016

(87) PCT Pub. No.: WO2016/176941
PCT Pub. Date: Nov. 10, 2016

(65) Prior Publication Data

US 2017/0373123 A1 Dec. 28, 2017

(30) Foreign Application Priority Data

May 4, 2015 (CN) .......................... 2015 1 0221957

(51) Int. Cl.
*H01L 27/32* (2006.01)
*H01L 51/52* (2006.01)
(Continued)

(52) U.S. Cl.
CPC ............ *H01L 27/3211* (2013.01); *G09G 3/32* (2013.01); *H01L 27/322* (2013.01);
(Continued)

(58) Field of Classification Search
CPC ............. H01L 27/3211; H01L 51/5036; H01L 2227/32; G09G 3/32
See application file for complete search history.

(56) References Cited

U.S. PATENT DOCUMENTS 8,796,719 B2 8/2014 Ohe et al.
9,247,613 B2 1/2016 Yang et al.
(Continued)

FOREIGN PATENT DOCUMENTS

CN 102771188 A 11/2012
CN 103227189 A 7/2013
(Continued)

OTHER PUBLICATIONS

Second Office Action for Chinese Patent Application No. 201510221957.3, dated Dec. 21, 2017, 10 pages.
(Continued)

*Primary Examiner* — Nathan L Van Sell
(74) *Attorney, Agent, or Firm* — Westman, Champlin & Koehler, P.A.

(57) ABSTRACT

The present disclosure provides an organic electroluminescence device. It includes a substrate; an array of TFTs provided on the substrate; an organic electroluminescence layer provided on the array of TFTs; a light filter layer; wherein an optical film layer is provided between the light filter layer and the organic electroluminescence layer, and has a periodically uneven surface structure made of nanoparticles.

4 Claims, 4 Drawing Sheets

(51) Int. Cl.
*H01L 51/50* (2006.01)
*G09G 3/32* (2016.01)

(52) U.S. Cl.
CPC ...... *H01L 51/5036* (2013.01); *H01L 51/5268* (2013.01); *H01L 51/5275* (2013.01); *H01L 2227/32* (2013.01)

(56) References Cited

U.S. PATENT DOCUMENTS

| | | | | |
|---|---|---|---|---|
| 2006/0121308 | A1* | 6/2006 | Katoh | C09K 11/06 428/690 |
| 2012/0326180 | A1* | 12/2012 | Ohe | H01L 27/322 257/88 |
| 2015/0077966 | A1 | 3/2015 | Bessho et al. | |
| 2015/0171372 | A1* | 6/2015 | Iwata | C09D 5/22 257/40 |
| 2015/0323711 | A1* | 11/2015 | Bessho | G02B 5/0242 349/71 |

FOREIGN PATENT DOCUMENTS

| | | | |
|---|---|---|---|
| CN | 203179892 | U | 9/2013 |
| CN | 104821328 | A | 8/2015 |
| WO | 2013/145914 | A1 | 10/2013 |
| WO | 2014/084012 | A1 | 6/2014 |

OTHER PUBLICATIONS

International Search Report and Written Opinion, including English translation of Box No. V of the Written Opinion, for International Application No. PCT/CN2015/089345, dated Feb. 6, 2016, 13 pages.

First Office Action, including Search Report, for Chinese Patent Application No. 201510221957.3, dated Apr. 19, 2017, 11 pages.

Third Office Action, including Search Report, for Chinese Patent Application No. 201510221957.3, dated May 14, 2018, 10 pages.

* cited by examiner

ORGANIC ELECTROLUMINESCENCE DEVICE AND METHOD FOR PRODUCING THE SAME

CROSS-REFERENCE TO RELATED APPLICATION

This application is a Section 371 National Stage Application of International Application No. PCT/CN2015/089345, filed on Sep. 10, 2015, entitled "Organic Electroluminescence Device, and Method for Producing the Same", which has not yet published, and which claims priority to Chinese Application No. 201510221957.3, filed on May 4, 2015, incorporated herein by reference in their entirety.

BACKGROUND OF THE INVENTION

Field of the Invention

The present disclosure relates to an organic electroluminescence device and a method for producing the same.

Description of the Related Art

In the prior art, as compared with LCD, organic electroluminescence devices (OLEDs) serving as a new type of flat panel displays, have advantages such as of small thickness, low weight, wide visual angles, active luminescence, continuous adjustability of light colors, low cost, rapid response speed, low energy consumption, small driving voltage, wide range of operation temperature, simple production process, high efficiency of light emission and flexible display, or the like. Due to incomparable advantages over other kinds of displays, OLED has drawn attention of the person skilled in the art.

In the prior art, an OLED is composed of an anode, a cathode and an organic layer. As shown in FIG. 1, an OLED 20 in the prior art includes a substrate 25, an array of thin film transistors (TFTs) 24 provided on the substrate, an organic electroluminescence layer 23 provided on the array of TFTs, a light filter layer 22, and a packaging layer 21. However, the organic electroluminescence layer 23 with the above mentioned structure has a relatively low utilization efficiency of light, and thus a white light cannot be obtained with high efficiency.

SUMMARY

The present disclosure aims to at least overcome at least one aspect of the problems and defects in the prior art.

The present application provides an organic electroluminescence device, comprising:

a substrate;

an array of TFTs provided on the substrate;

an organic electroluminescence layer s provided on the array of TFTs;

a light filter layer;

wherein an optical film layer is provided between the light filter layer and the organic electroluminescence layer, and has a periodically uneven surface structure made of nano-particles.

In an embodiment of the present application, the light filter layer comprises a red light filter layer, a green light filter layer and a blue light filter layer.

In an embodiment of the present application, the optical film layer is provided below any one, any two or all of the red light filter layer the green light filter layer and the blue light filter layer.

In an embodiment of the present application, the optical film layer is formed by macromolecular nano-particles.

In an embodiment of the present application, the macromolecular nano-particles are nano-particles of polystyrene.

In an embodiment of the present application, the optical film layer is of a pore structure.

In an embodiment of the present application, the nano-particles of the optical film layer which is provided below the red light filter layer have a diameter larger than that of the nano-particles of the optical film layer which is provided below the blue light filter layer, and the nano-particles of the optical film layer which is provided below the green light filter layer have the diameter between the diameter of the particles in the optical film layer which is provided below the blue light filter layer and that of the particles in the optical film layer which is provided below the red light filter layer.

In an embodiment of the present application, the nano-particles of the optical film layer which is provided below the green light filter layer have a diameter of 500-600 nm, and the nano-particles of the optical film layer which is provided below the blue light filter layer have a diameter of 300-400 nm.

In accordance with another aspect of the present application, it provides a method for producing an organic electroluminescence device, which is the organic electroluminescence device as described above, the method comprising the steps of:

providing a substrate;

forming an array of TFTs on the substrate;

forming an organic electroluminescence layer on the array of TFTs;

forming an optical film layer on the organic electroluminescence layer;

forming a light filter layer on the optical film layer, wherein the optical film layer has a periodically uneven surface structure formed of nano-particles.

In an embodiment of the present application, the nano-particles of polymer are spin-coated on the organic electroluminescence layer, so as to form the optical film layer.

In an embodiment of the present application, the step of forming the optical film layer comprises:

spin-coating a red resin onto a surface of the organic electroluminescence layer, and forming a red light filter layer by processes of exposure and development;

spin-coating nano-particles of polystyrene onto the resultant surface in the preceding step so as to form a first optical film layer;

spin-coating a green resin onto the resultant surface in the preceding step and forming a green light filter layer by processes of exposure and development, wherein the first optical film layer is provided between the green light filter layer and the resultant surface of the organic electroluminescence layer;

spin-coating nano-particles of polystyrene again onto the resultant surface in the preceding step so as to form a second optical film layer;

spin-coating a blue resin onto the resultant surface in the preceding step and forming a blue light filter layer by processes of exposure and development, wherein the second optical film layer is provided between the blue light filter layer and the surface of the organic electroluminescence layer.

In an embodiment of the present application, the particles in the first optical film layer have a diameter of 500-600 nm and the particles in the second optical film layer have a diameter of 300-400 nm.

In an embodiment of the present application, after forming the light filer layer, a packaging layer is formed on the light filter layer by a process of spin-coating.

BRIEF DESCRIPTION OF THE DRAWINGS

These and/or other aspects and advantages of the present application will become more apparent and understandable from the description of the preferred embodiments with reference to the accompanying drawings, in which.

DETAINED DESCRIPTION OF PREFERRED EMBODIMENTS OF THE INVENTION

Below, embodiments of the present application will be described in detail with reference to the accompanying drawings, in which the same reference symbols indicate the same components or elements. However, the present application has many embodiments, and thus cannot be interpreted to be limited to the described embodiments. It is only intended to enable the present disclosure to be full and complete by provision of these embodiments, and to fully convey the inventive concept of the present disclosure to the person skilled in the art.

Figure 1:
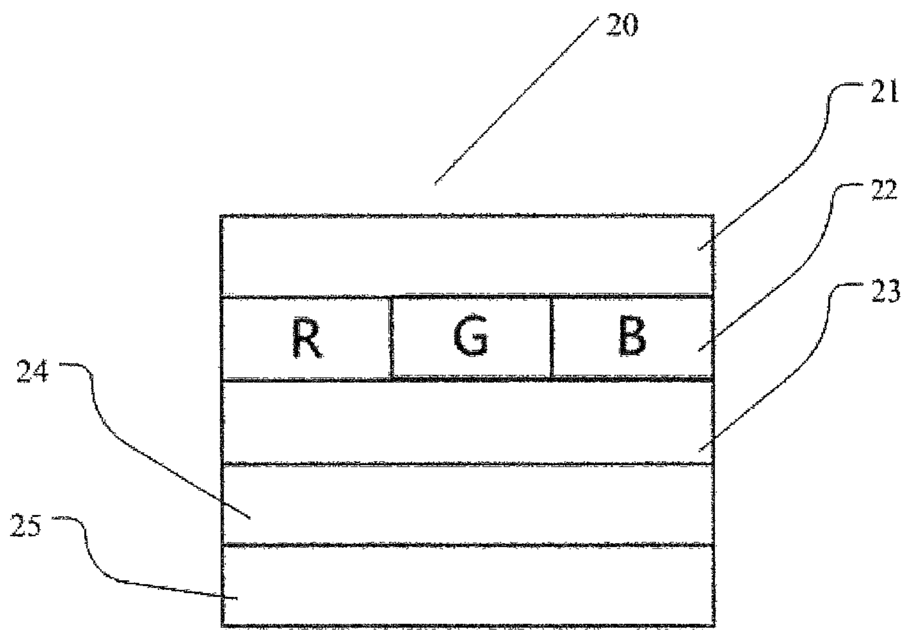
FIG. 1 is a schematic view for showing a structure of an OLED in the prior art.
Figure 2:
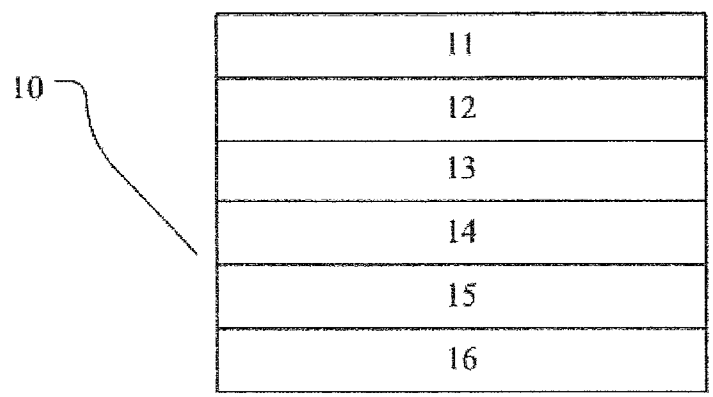
FIG. 2 is a schematic view of an OLED in accordance with an embodiment of the present application.

As shown in FIG. 2, it shows a structure of an organic electroluminescence device (hereinafter called as OLED) in accordance with an embodiment of the present application. Specifically, the organic electroluminescence device (OLED) 10 in accordance with the embodiment of the present application includes a substrate 16; an array of TFTs 15 provided on the substrate 16; an organic electroluminescence layer 14 provided on the array of TFTs; and a light filter layer 12. An optical film layer 13 is provided between the light filtering layer 12 and the organic electroluminescence layer 14, and has a periodically uneven surface structure formed by nano particles. The term "periodically uneven surface structure" used herein can be meant to any uneven structure, but the change thereof shall be periodic. Such structure can improve refractivity of a surface of the optical film layer 13, so as to emit the light incident onto the organic electroluminescence layer 14 in a refractive way out rather than being totally reflected, as possible as it can. Therefore, an OLED display device with higher efficiency is obtained.

In an embodiment of the present application, the light filter layer 12 includes red light filter layers, green light filter layers and blue light filter layers arranged in a predetermined pattern.

Figure 3:
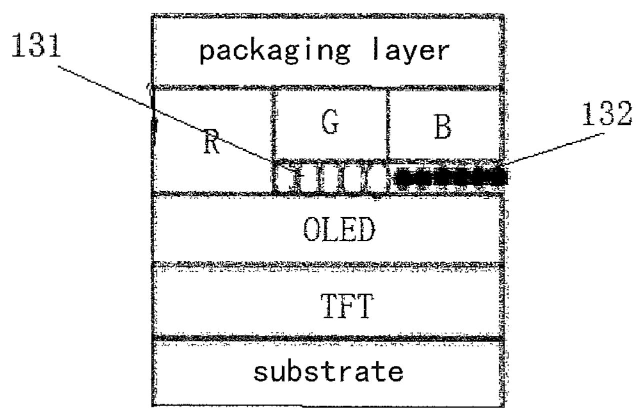
FIG. 3 is a schematic view of an embodiment of the OLED in accordance with the present application.

In an embodiment of the present application, the optical film layer 13 is disposed below any one, or any two or all of the red light filter layers, the green light filter layers and the blue light filter layers. As shown in FIG. 3, a first optical film layer 131 is disposed below the green light filter layer and a second optical film layer 132 is disposed below the blue light filter layer.

The above setting way is not to limit the present application, for example, the optical film layer 13 can be provided below the red light filter layer, the green light filter layer and the blue light filter layer; can also be provided below both the red light filter layer and the green light filter layer; or can be provided below only any one of the red, green and blue light filter layers.

In the embodiment of the present application, the optical film layer 13 is formed by macromolecular nano-particles, for example, the nano-particles of polystyrene. Of course, the person skilled in the art can employ other materials to form the optical film layer 13. The optical film layer 13 is of a pore structure. The optical film layer 13 is provided on the surface of the organic electroluminescence layer 14, so as to help to change the refractivity of its surface. That is, the light incident onto the organic electroluminescence layer is emitted out in a refractive way rather than being totally reflected, as possible as it can, thereby improving light out-going efficiency of the OLED. Diameters of pores in the pore structure are controlled so as to control wavelengths of the OLED at different positions, thereby obtaining an OLED display device having a wider color gamut and a higher efficiency.

The nano-particles having different diameters in the optical film layer 13 will produce different gain effects to the light having different wavelengths. When the nano-particles have less diameters, they will be helpful to emit blue light; and when the nano-particles have larger diameters, they will be helpful to emit red and green light.

Therefore, in an embodiment of the present application, the particles in the optical film layer 13 which are provided below the light filter layer having different colors have different diameters. Specifically, the particles in the optical film layer 13 which is provided below the red light filter layer have the diameter larger than that of the particles in the optical film layer 13 which is provided below the blue light filter layer. The particles in the optical film layer 13 which is provided below the green light filter layer have the diameter between the diameter of the particles in the optical film layer 13 which is provided below the blue light filter layer and that of the particles in the optical film layer 13 which is provided below the red light filter layer.

The diameter of the particles in the optical film layer is controlled so that the surface of the OLED will have different refractivity at different positions. In this way, the light emitted by the OLED will have different wavelengths at the different positions of the display panel, and thus the OLED having a wider color gamut will be obtained.

In accordance with another aspect of the present application, it provides a method for producing OLEDs, including the following steps of:

providing a substrate 16;

forming an array of TFTs 15 on the substrate 16;

forming an organic electroluminescence layer 14 on the array of TFTs 15;

forming an optical film layer 13 on the organic electroluminescence layer 14;

forming a light filter layer 12 on the optical film layer 13, wherein the optical film layer 13 has a periodically uneven surface structure formed of nano-particles.

In an embodiment of the present application, the macromolecular nano-particles are spin-coated onto the organic electroluminescence layer 14, so as to form the optical film layer 13. Of course, the above forming way is not intended to limit the technical solution of the present application, but the person skilled in the art can adopt other ways for example, printing or the like, to form the optical film layer 13.

Figure 4:
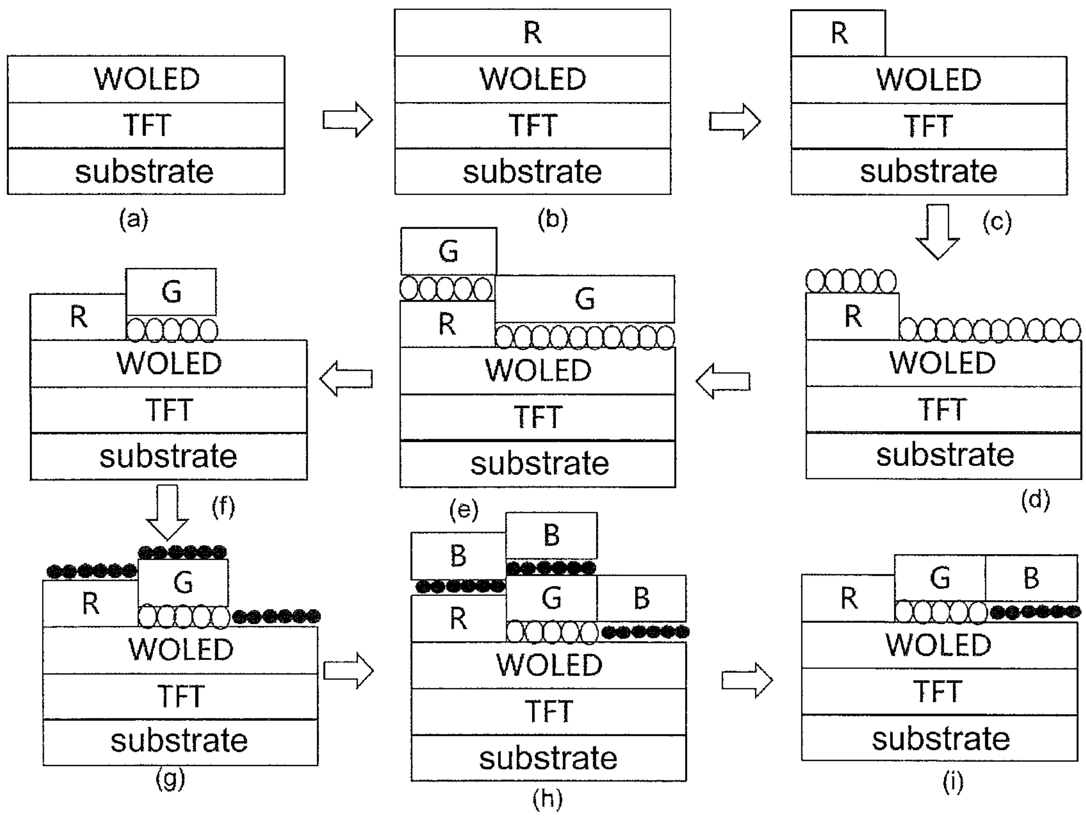
FIG. 4 is a flow chart of a method for producing the OLED in accordance with the embodiment of the present application.

Specifically, as shown in FIG. 4, the substrate 16 is shown in FIG. 4*a*, and after providing the substrate 16, the array of TFTs 15 is formed on the substrate 16 and the organic electroluminescence layer 14 is formed on the array of TFTs 15. Then, as shown in FIG. 4*b*, a red resin is spin-coated onto a surface of the organic electroluminescence layer 14. As shown in FIG. 4*c*, the red color light filter is formed by the processes such as exposure and development. After that, as shown in FIG. 4*d*, the nano-particles of polystyrene is spin-coated onto the resultant surface in the preceding step to form a first optical film layer 131, the particles in which have a diameter of 500-600 nm. As shown in FIG. 4*e*, a green resin is spin-coated on the resultant surface in the preceding step; and as shown in FIG. 4*f*, a green light filter layer is formed by the processes such as exposure and development. The first optical film layer 131 is arranged between the green light filter layer and the surface of the organic electroluminescence layer 14. As shown in FIG. 4*g*, the particles of polystyrene are again spin-coated on the resultant surface in the preceding step, so as to form a second optical film layer 132, in which the particles have a diameter of 300-400 nm. As shown in FIG. 4*h*, a blue resin is spin-coated on the resultant surface in the preceding step. As shown in FIG. 4*i*, a blue light filter layer is formed by the processes such as exposure and development, and the second optical film layer 132 is arranged between the blue light filter layer and the surface of the organic electroluminescence layer 14. Finally, a corresponding material is spin-coated onto the resultant surface in the preceding step, so as to form a packaging layer 11.

As for the OLED obtained by the above method, the optical film layer 13 (specifically the first optical film layer 131 and the second optical film layer 132) is formed between the green light filter layer and the surface of the organic electroluminescence layer 14, and between the blue light filter layer and the surface of the organic electroluminescence layer 14. The particles of the optical film layers which are provided below the green light filter layer and those which are provided below the blue light filter layer, have different diameters from each other. In other words, the first and second optical film layers 131 and 132 can function as different light conversion layers.

The above method is not intended to limit the present application. The persons skilled in the art can alter the sequence of the steps as described above as actually required, and provide different diameters for the nano-particles below different light filter layers 12. In addition, the person skilled in the art can also select other suitable materials to form the optical film layer 13.

Although the embodiments of the present application are presented and described herein, the person skilled in the art will understand that changes can be made to these embodiments without departing from the principles and spirits of the present application. The scopes of these changes shall be considered to fall within those of the appended claims of the present application and theirs equivalents.

What is claimed is:

1. An organic electroluminescence device, comprising:

a substrate;

an array of TFTs provided on the substrate;

an organic electroluminescence layer provided on the array of TFTs;

a light filter layer;

wherein an optical film layer is provided between the light filter layer and the organic electroluminescence layer, and has a periodically uneven surface structure formed of nano-particles so that the light incident on the organic electroluminescence layer is emitted out in a refractive way, wherein the optical film layer is formed by macromolecular nano-particles, and the macromolecular nano-particles are nano-particles of polystyrene, wherein the light filter layer comprises a red light filter layer, a green light filter layer and a blue light filter layer, the nano-particles of the optical film layer are absent below the red light filter layer, the nano-particles of the optical film layer which are provided below the green light filter layer have a diameter of 500-600 nm, and the nano-particles of the optical film layer which are provided below the blue light filter layer have a diameter of 300-400 nm.

2. The organic electroluminescence device according to claim 1, wherein the optical film layer is of a pore structure.

3. A method for producing an organic electroluminescence device, which is the organic electroluminescence device as claimed in claim 1, the method comprising the steps of:

providing a substrate;

forming an array of TFTs on the substrate;

forming an organic electroluminescence layer on the array of TFTs;

forming an optical film layer on the organic electroluminescence layer;

forming a light filter layer on the optical film layer, wherein the optical film layer has a periodically uneven surface structure formed of nano-particles, wherein the step of forming the optical film layer comprises:

spin-coating a red resin onto a surface of the organic electroluminescence layer, and forming a red light filter layer by processes of exposure and development;

spin-coating nano-particles of polystyrene onto the resultant surface formed in the preceding step so as to form a first optical film layer;

spin-coating a green resin onto the resultant surface formed in the preceding step and forming a green light filter layer by processes of exposure and development. wherein the first optical film layer is provided between the green light filter layer and the surface of the organic electroluminescence layer, and the particles in the first optical film layer have a diameter of 500-600 nm;

spin-coating nano-particles of polystyrene again onto the resultant surface formed in the preceding step so as to form a second optical film layer spin-coating a blue resin onto the resultant surface formed in the preceding step and forming a blue light filter layer by processes of exposure and development, wherein the second optical film layer is provided between the blue light filter layer and the surface of the organic electroluminescence layer, and the particles in the second optical film layer have a diameter of 300-400 nm.

4. The method according to claim 3, wherein after forming the light filer layer, a packaging layer is formed on the light filter layer by a process of spin-coating.

* * * * *